United States Patent
Wang et al.

(10) Patent No.: US 9,131,607 B2
(45) Date of Patent: *Sep. 8, 2015

(54) LOW DIELECTRIC RESIN COMPOSITION, COPPER CLAD LAMINATE USING THE SAME, AND PRINTED CIRCUIT BOARD USING THE SAME

(71) Applicant: ELITE ELECTRONIC MATERIAL (KUNSHAN) CO., LTD, Jiangsu Province (CN)

(72) Inventors: Rong-Tao Wang, Jiangsu Province (CN); Tse-An Lee, Tao-Yuan Hsien (TW); Yi-Jen Chen, Taoyuan County (TW); Wenjun Tian, Jiangsu Province (CN); Ziqian Ma, Jiangsu Province (CN); Wenfeng Lu, Jiangsu Province (CN)

(73) Assignee: ELITE ELECTRONIC MATERIAL (KUNSHAN) CO., LTD., Jiangsu Province (CN)

( * ) Notice: Subject to any disclaimer, the term of this patent is extended or adjusted under 35 U.S.C. 154(b) by 164 days.

This patent is subject to a terminal disclaimer.

(21) Appl. No.: 13/777,477

(22) Filed: Feb. 26, 2013

(65) Prior Publication Data

US 2014/0174802 A1    Jun. 26, 2014

(30) Foreign Application Priority Data

Dec. 21, 2012    (CN) .......................... 2012 1 0562188

(51) Int. Cl.
| | |
|---|---|
| *C08L 63/00* | (2006.01) |
| *H05K 1/03* | (2006.01) |
| *B32B 15/14* | (2006.01) |
| *B32B 15/20* | (2006.01) |

(52) U.S. Cl.
CPC .............. *H05K 1/0353* (2013.01); *B32B 15/14* (2013.01); *B32B 15/20* (2013.01); *C08L 63/00* (2013.01); *B32B 2305/076* (2013.01); *B32B 2457/08* (2013.01); *H05K 2201/012* (2013.01); *H05K 2201/0209* (2013.01); *Y10T 428/31529* (2015.04)

(58) Field of Classification Search
CPC ....................................................... C08L 63/00
USPC ........................................................ 523/439
See application file for complete search history.

(56) References Cited

U.S. PATENT DOCUMENTS

| | | | |
|---|---|---|---|
| 6,440,567 B1 | 8/2002 | Choate et al. | |
| 7,255,925 B2 | 8/2007 | Chung et al. | |
| 2010/0240811 A1* | 9/2010 | He et al. ......................... | 524/94 |
| 2010/0240816 A1* | 9/2010 | Liao et al. ..................... | 524/384 |
| 2010/0292415 A1* | 11/2010 | Reynolds et al. ............ | 525/533 |
| 2011/0224332 A1* | 9/2011 | He et al. ....................... | 523/456 |
| 2012/0136094 A1* | 5/2012 | Chen et al. .................... | 523/451 |
| 2013/0161080 A1* | 6/2013 | Lin ................................ | 174/257 |

FOREIGN PATENT DOCUMENTS

EP          0763566 A1    3/1997

* cited by examiner

*Primary Examiner* — Megan McCulley
(74) *Attorney, Agent, or Firm* — WPAT, P.C.; Anthony King

(57) ABSTRACT

A halogen-free resin composition includes (A) 100 parts by weight of naphthalene epoxy resin; (B) 10 to 100 parts by weight of styrene maleic anhydride copolymer; and (C) 30 to 70 parts by weight of DOPO-containing bisphenol F novolac resin. The halogen-free resin composition includes specific ingredients, and is characterized by specific proportions thereof, to thereby attain a low dielectric constant, a low dielectric dissipation factor, high heat resistance, and high flame retardation, and thus is suitable for producing a prepreg or a resin film to thereby be applicable to copper clad laminates and printed circuit boards.

8 Claims, No Drawings

LOW DIELECTRIC RESIN COMPOSITION, COPPER CLAD LAMINATE USING THE SAME, AND PRINTED CIRCUIT BOARD USING THE SAME

CROSS-REFERENCE TO RELATED APPLICATION

This non-provisional application claims priority under 35 U.S.C. §119(a) on Patent Application No(s). 201210562188.X filed in China on Dec. 21, 2012, the entire contents of which are hereby incorporated by reference.

FIELD OF THE INVENTION

The present invention relates to halogen-free resin compositions, and more particularly, to a halogen-free resin composition applicable to copper clad laminates and printed circuit boards.

BACKGROUND OF THE INVENTION

To get in line with the global trend of environmental protection, and eco-friendly regulations, electronic product manufacturers nowadays are developing, and manufacturing halogen-free electronic products. Advanced countries, and electronic manufacturing giants set forth schedules of launching mass production of halogen-free electronic products. As a result of the promulgation of the Restriction of Hazardous Substances (RoHS) by the European Union, hazardous substances, such as lead, cadmium, mercury, hexavalent chromium, poly-brominated biphenyl (PBB), and poly-brominated diphenyl ether (PBDE), are strictly prohibited from being used in manufacturing electronic products or their parts, and components. A printed circuit board (PCB) is an indispensable, and fundamental basis of the semiconductor industry, and electronic industry; hence, printed circuit boards bore the brunt of international halogen-free regulations when international organizations set forth strict requirements of the halogen content of printed circuit boards. For example, the International Electrotechnical Commission (IEC) 6 1249-2-21 requires that bromide content, and chloride content shall be less than 900 ppm, and the total halogen content shall be less than 1500 ppm. The Japan Electronics Packaging and Circuits Association (JPCA) requires that both bromide content, and chloride content shall be less than 900 ppm. To enforce its green policies, Greenpeace calls on manufacturers worldwide to get rid of polyvinyl chloride (PVC), and brominated flame retardants (BFRs) from their electronic products in order to conform with the lead-free, and halogen-free requirements of green electronics. Hence, the industrial sector nowadays is interested in rendering related materials halogen-free, and sees this technique as one of its key research topics.

Electronic products nowadays have the trend toward compactness, and high-frequency transmission; hence, circuit boards nowadays typically feature a high-density layout, and increasingly strict material requirements. To mount high-frequency electronic components on a circuit board, it is necessary that the substrate of the circuit board is made of a material of a low dielectric constant (Dk), and dielectric dissipation factor (Df) in order to maintain the transmission speed, and the integrity of a signal transmitted. To allow the electronic components to operate well at a high temperature, and a high-humidity environment, it is necessary for the circuit board to be heat resistant, fire resistant, and of low hygroscopicity. Epoxy resin is adhesive, heat resistant, and malleable, and thus is widely applicable to encapsulants, and copper clad laminates (CCL) of electronic components, and machinery. From the perspective of fire prevention, and safety, any applicable material is required to be capable of flame retardation. In general, epoxy resin is incapable of flame retardation, and thus epoxy resin has to acquire flame retardation capability by including a flame retardant therein. For example, a halogen, especially bromine, is included in epoxy resin to bring about flame retardation capability of epoxy resin, and enhance the reactivity of the epoxy group. Furthermore, when exposed to a high temperature for a long period of time, a halogen compound is likely to decompose, and thereby erode a fine circuit. Furthermore, combustion of discarded used electronic parts, and components produces hazardous compounds, such as halogen compounds, which are environmentally unfriendly. To find an alternative to the aforesaid halogen compound-based flame retardant, researchers attempt to use a phosphorous compound as a flame retardant, for example, adding phosphate ester (U.S. Pat. No. 6,440,567) or red phosphorus (EP 0763566) to an epoxy resin composition. However, phosphate ester undergoes hydrolysis readily to produce an acid, thereby compromising its tolerance to migration. Although red phosphorus is good at flame retardation, it falls into the category of hazardous compounds under the firefighting law, because it produces a trace of a flammable, toxic gas known as phosphine in a warm humid environment.

A conventional circuit board manufacturing method, such as a conventional method of manufacturing a copper-clad substrate (also known as copper clad laminate, CCL), involves heating, and combining a reinforcement material (such as a glass fiber fabric), and a thermosetting resin composition made of an epoxy resin, and a curing agent to form a prepreg, and then laminating the prepreg, and the upper and lower copper foils together at a high temperature, and a high pressure. The prior art usually teaches using a thermosetting resin composed of an epoxy resin, and a hydroxyl-containing phenol novolac resin curing agent. Due to the combination of the phenol novolac resin, and the epoxy resin, epoxide ring-opening reactions end up with another hydroxyl which not only increases the dielectric constant (Dk), and the dielectric dissipation factor inherently, but also reacts with water readily, and thereby renders the thermosetting resin more hygroscopic.

U.S. Pat. No. 7,255,925 discloses a thermosetting resin composition composed of cyanate ester resin, dicyclopentadiene (DCPD) epoxy resin, silica, and a thermoplastic resin. The thermosetting resin composition is characterized by a low dielectric constant (Dk), and a low dielectric dissipation factor. However, a method for manufacturing the thermosetting resin composition of U.S. Pat. No. 7,255,925 requires the use of a halogen-containing (such as bromine-containing) flame retardant, such as tetrabromocyclohexane, hexabromocyclodecane, or 2,4,6-tris(tribromophenoxy)-1,3,5-triazine. However, the bromine-containing flame retardant causes environmental pollution readily during the thermosetting resin composition manufacturing process, the using processing of thermosetting resin composition, and even after the thermosetting resin composition has been discarded or recycled. To ensure a low dielectric dissipation factor, low hygroscopicity, high cross-linking density, high glass transition temperature, high connectivity, appropriate thermal expansion, heat resistance, and fire resistance of copper clad laminates, an important factor lies in the selection of an epoxy resin, a curing agent, and a reinforcement material.

The major considerations given to electrical properties include the dielectric constant (Dk), and the dielectric dissipation factor. In general, the signal transmission speed of a copper-clad substrate is inversely proportional to the square root of the dielectric constant (Dk) of the material from which the copper-clad substrate is made, and thus the minimization of the dielectric constant (Dk) of the substrate material is usually advantageously important. The lower the dielectric dissipation factor is, the lesser the signal transmission attenuation is; hence, a material of a low dielectric dissipation factor provides satisfactory transmission quality.

Accordingly, it is important for printed circuit board material suppliers to develop materials of a low dielectric constant (Dk), and a low dielectric dissipation factor, and apply the materials to high-frequency printed circuit board manufacturing.

SUMMARY OF THE INVENTION

In view of the aforesaid drawbacks of the prior art, the inventor of the present invention conceived room for improvement in the prior art, and thus conducted extensive researches, and experiments according to the inventor's years of experience in the related industry, and finally developed a halogen-free resin composition as disclosed in the present invention to achieve a low dielectric constant (Dk), a low dissipation factor (Df), high heat resistance, and high flame retardation.

It is an objective of the present invention to provide a halogen-free resin composition comprising specific ingredients, and characterized by specific proportions thereof so as to achieve a low dielectric constant (Dk), a low dielectric dissipation factor, high heat resistance, and high flame retardation. The halogen-free resin composition is suitable for producing a prepreg or a resin film, and thus applicable to copper clad laminates, and printed circuit boards.

In order to achieve the above and other objectives, the present invention provides a halogen-free resin composition comprising: (A) 100 parts by weight of naphthalene epoxy resin; (B) 10 to 100 parts by weight of styrene maleic anhydride (SMA) copolymer; and (C) 30 to 70 parts by weight of DOPO-containing bisphenol F novolac (BPFN) resin.

As regards its purpose, the halogen-free resin composition is applicable to the manufacturing of a prepreg, a resin film, a copper clad laminate, and a printed circuit board. Therefore, the halogen-free resin composition of the present invention is characterized by specific ingredients which are of specific proportions, so as to achieve a low dielectric constant (Dk), a low dissipation factor (Df), high heat resistance, and high flame retardation. Therefore, the halogen-free resin composition of the present invention is effective in manufacturing a prepreg or a resin film and thereby applicable to copper clad laminates and printed circuit boards.

As regards the halogen-free resin composition of the present invention, the ingredient (A) naphthalene epoxy resin comprises naphthalene structure and is commercially available with brand names, such as EXA-9900, HP-5000, and HP-5000L which are manufactured by DIC.

The halogen-free resin composition of the present invention includes 100 parts by weight of naphthalene epoxy resin. The ingredient (A) naphthalene epoxy resin is characterized in that its naphthalene structure are less likely to decompose than conventional benzene derivatives of benzene epoxy resin, such as BPA (bisphenol A) epoxy resin, BPAN (bisphenol A novolac) epoxy resin, PN (phenol novolac) epoxy resin, CN (cresol novolac) epoxy resin, and thus exhibits high heat resistance, high glass transition temperature, and lower (better) dielectric properties (Dk and Df). Due to the presence of the naphthalene epoxy resin, the resin composition of the present invention can achieve higher heat resistance and better dielectric properties. The halogen-free resin composition of the present invention includes naphthalene epoxy resin. Copper clad laminates made of the halogen-free resin composition exhibit lower dielectric properties as well as better heat resistance and flame retardation. Conventional copper clad laminates made of benzene epoxy resin exhibit poor dielectric properties, poor heat resistance, and poor flame retardation, not to mention that they cannot achieve flame retardation of the UL94 V-0 flame retardation level without including a large amount of flame retardants at the expense of further deterioration of dielectric properties.

As regards the halogen-free resin composition of the present invention, the styrene (S) to maleic anhydride (MA) ratio of the ingredient (B) styrene maleic anhydride copolymer is, for example, 1/1, 2/1, 3/1, 4/1, 6/1 or 8/1, and the ingredient (B) styrene maleic anhydride copolymer is commercially available with brand names, such as SMA-1000, SMA-2000, SMA-3000, EF-30, EF-40, EF-60, and EF-80 manufactured by Sartomer. The styrene maleic anhydride copolymer can also be an esterified styrene maleic anhydride copolymer which is commercially available with brand names, such as SMA1440, SMA17352, SMA2625, SMA3840, and SMA31890. The halogen-free resin composition of the present invention includes one, or a combination, of the aforesaid two types of styrene maleic anhydride copolymer.

Compared with a crosslinking agent (i.e., a curing agent), such as novolac resin, or an amine curing agent (such as dicyandiamide (DICY) or diamino-diphenyl sulfone (DDS)), which is usually adapted for use with epoxy resins, styrene maleic anhydride copolymer exhibits lower dielectric properties.

As regards the halogen-free resin composition of the present invention, given 100 parts by weight of naphthalene epoxy resin, 10 to 100 parts by weight of styrene maleic anhydride copolymer is added thereto, wherein the content of the styrene maleic anhydride copolymer thus added allows the halogen-free resin composition to achieve the expected low dielectric properties in conjunction with the naphthalene epoxy resin. If less than 10 parts by weight of the styrene maleic anhydride copolymer is added, the expected low dielectric properties will not be achieved. If more than 100 parts by weight of the styrene maleic anhydride copolymer is added, the prepreg made from the resin composition will manifest poor appearance and tendency to peel off, thereby deteriorating the prepreg's conforming rate during the manufacturing process thereof. Specifically speaking, preferably, 15 to 70 parts by weight of the styrene maleic anhydride copolymer is added in order to prepare the halogen-free resin composition of the present invention.

As regards the halogen-free resin composition of the present invention, the ingredient (C) is DOPO-containing bisphenol F novolac (BPFN) resin (or abbreviated as DOPO-BPFN resin, or DOPO-bisphenol F novolac resin), which is commercially available with a brand name, that is, XLC-950 manufactured by Shin-A. The DOPO molecular structure is capable of flame retardation and is environmentally-friendly because it dose not contain bromine. The DOPO-containing bisphenol F novolac (BPFN) resin can produce a phosphorus coke layer which covers the combustion part while flaming and thus cuts off ambient oxygen supply, thereby effectuating flame retardation. Furthermore, the hydroxyl group of the DOPO-containing bisphenol F novolac (BPFN) resin functions as a co-crosslinking agent whereby the DOPO-containing bisphenol F novolac (BPFN) resin cross-links with styrene maleic anhydride copolymer and cross-links with epoxy resin, respectively. Also, because of the crosslinked action, the DOPO-containing bisphenol F novolac (BPFN) resin has such advantages as thermal stability and chemical stability. Furthermore, the DOPO-containing bisphenol F novolac (BPFN) resin advantageously exhibits a higher degree of flexibility than DOPO-BPA and DOPO-BPAN resin and thus enhances the flexibility of the resin composition of the present invention. Last but not least, the DOPO-containing bisphenol F novolac (BPFN) resin, coupled with the naphthalene epoxy resin, alleviates the overly high rigidity and overly low flexibility of the naphthalene epoxy resin.

As regards the halogen-free resin composition of the present invention, given 100 parts by weight of epoxy resin, 30 to 70 parts by weight of DOPO-containing BPFN resin is added thereto, wherein the content of the DOPO-containing BPFN resin thus added allows the halogen-free resin composition to achieve flame retardation as expected. If less than 30 parts by weight of the DOPO-containing BPFN resin is added, the expected flame retardation will not be achieved. If more than 70 parts by weight of the DOPO-containing BPFN resin is added, not only will the hygroscopicity of the halogen-free resin composition of the present invention increase, but the heat resistance of copper clad laminates will also deteriorate.

As regards the halogen-free resin composition of the present invention, given 100 parts by weight of epoxy resin, 10 to 70 parts by weight of benzoxazine resin is added thereto, wherein the content of the benzoxazine resin thus added allows the dielectric dissipation factor (Df) of the halogen-free resin composition to decrease slightly and thereby improves the dielectric properties thereof. If less than 10 parts by weight of the benzoxazine resin is added, the dielectric dissipation factor (Df) of the halogen-free resin composition will not decrease. If more than 70 parts by weight of the benzoxazine resin is added, the heat resistance of copper clad laminates made of the resin composition of the present invention will deteriorate.

The halogen-free resin composition of the present invention further comprises an inorganic filler, a curing accelerator, a silane coupling agent, a toughening agent, and/or a solvent.

The purpose of adding an inorganic filler to the halogen-free resin composition of the present invention is to increase the thermal conductivity, improve the thermal expandability and mechanical strength of the halogen-free resin composition. Preferably, the inorganic filler is uniformly distributed in the resin composition. The inorganic filler comprises silicon dioxide (existing in a molten state or a non-molten state, or featuring a porous structure or a hollow-core structure), aluminum oxide, aluminum hydroxide, magnesium oxide, magnesium hydroxide, calcium carbonate, aluminum nitride, boron nitride, aluminum silicon carbide, silicon carbide, titanium dioxide, zinc oxide, zirconium oxide, mica, boehmite (AlOOH), calcinated talcum, talcum, silicon nitride, and/or calcinated kaolin clay. The inorganic filler comes in the form of a spherical shape, a fiber-like shape, board-like shape, particulate shape, strip-like shape, or needle-like shape, and can be selectively pre-treated with a silane coupling agent.

The inorganic filler can be in the form of particulate powder of a diameter of less than 100 μm, or preferably a diameter of 1 nm to 20 μm, or most preferably a diameter of less than 1 μm, i.e., nanoscale particulate powder. The needle-shaped inorganic filler consists of particles each having a diameter of less than 50 μm and a length of 1 to 200 μm.

As regards the halogen-free resin composition of the present invention, given 100 parts by weight of epoxy resin, 10 to 1000 parts by weight of an inorganic filler is added thereto. If less than 10 parts by weight of the inorganic filler is added, the halogen-free resin composition will not manifest significant capability of heat conduction, improved thermal expansion, or enhanced mechanical strength. If more than 1000 parts by weight of the inorganic filler is added, the halogen-free resin composition will manifest deteriorated pore-filling mobility and deteriorated adhesion of copper foil.

The curing accelerator of the present invention comprise a catalysts, such as a Lewis base or a Lewis acid. The Lewis base includes imidazole, boron trifluoride amine complex, ethyltriphenyl phosphonium chloride, 2-methylimidazole (2MI), 2-phenyl-1H-imidazole (2PZ), 2-ethyl-4-methylimidazole (2E4MI), triphenylphosphine (TPP), and/or 4-dimethylaminopyridine (DMAP). The Lewis acid comprises a metal salt compound, such as a manganese, iron, cobalt, nickel, copper, or zinc metal salt compound, for example, a metal catalyst, such as zinc caprylate, or cobalt caprylate.

The silane coupling agent of the present invention comprises silane and siloxane, and, when categorized according to a functional group, includes amino silane (AS), amino siloxane, epoxy silane, and epoxy siloxane.

The toughening agent of the present invention comprises an additive selected from the group consisting of rubber resin, carboxyl-terminated butadiene acrylonitrile (CTBN) rubber, and core-shell rubber.

The solvent of the present invention comprises one selected from the group consisting of methanol, ethanol, ethylene glycol monomethyl ether, acetone, butanone (methyl ethyl ketone, MEK), methyl isobutyl ketone (MIBK), cyclohexanone, toluene, xylene, methoxyethyl acetate, ethoxyethyl acetate, propoxyethyl acetate, ethyl acetate, dimethylformamide, propylene glycol methyl ether, and a mixture thereof.

The halogen-free resin composition of the present invention further comprises one of phenol resin, phenol novolac resin, polyphenylene ether resin, cyanate ester resin, isocyanate ester resin, maleimide resin, polyester resin, styrene resin, butadiene resin, phenoxy resin, polyamide resin, and polyimide resin, or a combination thereof.

Yet another objective of the present invention is to provide a prepreg (PP). The prepreg has a low dielectric constant (Dk), a low dielectric dissipation factor, high heat resistance, high flame retardation, low hygroscopicity, and halogen-free characteristics. Accordingly, the prepreg of the present invention comprises a reinforcement material and the aforesaid halogen-free resin composition, wherein the halogen-free resin composition is attached to the reinforcement material by means of impregnation, and heated up at a high temperature to be semi-cured. The reinforcement material, which is a fibrous material, a woven fabric, or a non-woven fabric, such as a glass fiber fabric, enhances the mechanical strength of the prepreg. Furthermore, the reinforcement material can be selectively pretreated with a silane coupling agent or a siloxane coupling agent. For example, the reinforcement material is a glass fiber fabric pretreated with a silane coupling agent.

The aforesaid prepreg is heated up at a high temperature or heated at a high temperature and a high pressure to be cured and become a prepreg or a solid-state insulating layer. If the halogen-free resin composition comprises a solvent, the solvent vaporizes during a high-temperature heating process and vanishes.

A further objective of the present invention is to provide a copper clad laminate. The copper clad laminate has a low dielectric characteristic, high heat resistance, high flame retardation, low hygroscopicity, and halogen-free characteristics, and is especially applicable to a circuit board for use in high-speed and high-frequency signal transmission. Accordingly, the present invention provides a copper clad laminate that comprises two or more copper foils and at least an insulating layer. The copper foils are made of an alloy that contains copper and at least one of aluminum, nickel, platinum, silver, and gold. The insulating layer is formed by curing the aforesaid prepreg at a high temperature and a high pressure. For example, the aforesaid prepreg is sandwiched between the two copper foils, and then the two copper foils and the prepreg therebetween are laminated together at a high temperature and a high pressure.

The copper clad laminate of the present invention has at least one of the following advantages: a low dielectric constant (Dk) and a low dielectric dissipation factor; excellent heat resistance and flame retardation; low hygroscopicity; high thermal conductivity; and being environmentally friendly by being halogen-free. The copper clad laminate is further processed by circuit-making process to become a circuit board. After electronic components have been mounted on the circuit board, the circuit board and the electronic components thereon can operate well in an adverse environment, such as a high temperature and a high humidity, without having their performance compromised.

A further objective of the present invention is to provide a printed circuit board. The printed circuit board has a low dielectric characteristic, high heat resistance, and high flame retardation, low hygroscopicity, and halogen-free characteristics, and is applicable to high-speed and high-frequency signal transmission. The circuit board comprises at least one aforesaid copper clad laminate and is manufactured by a conventional process.

The present invention is disclosed below by several preferred embodiments. However, persons skilled in the art should understand that the preferred embodiments are illustrative of the present invention only, but should not be interpreted as restrictive of the scope of the present invention. Hence, all equivalent modifications and changes made to the aforesaid embodiments should fall within the scope of the present invention, provided that they do not depart from the spirit of the present invention.

DETAILED DESCRIPTION OF THE PREFERRED EMBODIMENTS

Objectives, features, and advantages of the present invention are hereunder illustrated with specific embodiments.

Embodiment 1 (E1)

A resin composition, comprising ingredients as follows:
(A) 100 parts by weight of naphthalene epoxy resin (EXA-9900);
(B) 70 parts by weight of styrene maleic anhydride copolymer (EF-40);
(C) 50 parts by weight of DOPO-BPFN (XLC-950);
(D) 50 parts by weight of fused silica;
(E) 0.3 parts by weight of catalyst (2E4MI); and
(F) 60 parts by weight of methyl ethyl ketone (MEK).

Embodiment 2 (E2)

A resin composition, comprising ingredients as follows:
(A) 100 parts by weight of naphthalene epoxy resin (EXA-9900);
(B) 5 parts by weight of styrene maleic anhydride copolymer (EF-40);
(C) 50 parts by weight of DOPO-BPFN (XLC-950);
(D) 50 parts by weight of fused silica;
(E) 0.3 parts by weight of catalyst (2E4MI); and
(F) 60 parts by weight of methyl ethyl ketone (MEK).

Embodiment 3 (E3)

A resin composition, comprising ingredients as follows:
(A) 100 parts by weight of naphthalene epoxy resin (EXA-9900);
(B) 100 parts by weight of styrene maleic anhydride copolymer (EF-40);
(C) 50 parts by weight of DOPO-BPFN (XLC-950);
(D) 50 parts by weight of fused silica;
(E) 0.3 parts by weight of catalyst (2E4MI); and
(F) 60 parts by weight of methyl ethyl ketone (MEK).

Embodiment 4 (E4)

A resin composition, comprising ingredients as follows:
(A) 100 parts by weight of naphthalene epoxy resin (EXA-9900);
(B) 70 parts by weight of styrene maleic anhydride copolymer (EF-40);
(C) 25 parts by weight of DOPO-BPFN (XLC-950);
(D) 50 parts by weight of fused silica;
(E) 0.3 parts by weight of catalyst (2E4MI); and
(F) 60 parts by weight of methyl ethyl ketone (MEK).

Embodiment 5 (E5)

A resin composition, comprising ingredients as follows:
(A) 100 parts by weight of naphthalene epoxy resin (EXA-9900);
(B) 70 parts by weight of styrene maleic anhydride copolymer (EF-40);
(C) 80 parts by weight of DOPO-BPFN (XLC-950);
(D) 50 parts by weight of fused silica;
(E) 0.3 parts by weight of catalyst (2E4MI); and
(F) 60 parts by weight of methyl ethyl ketone (MEK).

Embodiment 6 (E6)

A resin composition, comprising ingredients as follows:
(A) 100 parts by weight of naphthalene epoxy resin (EXA-9900);
(B) 40 parts by weight of styrene maleic anhydride copolymer (EF-40);
(C) 45 parts by weight of DOPO-BPFN (XLC-950);
(D) 60 parts by weight of benzoxazine resin (LZ 8280);
(E) 50 parts by weight of fused silica;
(F) 0.3 parts by weight of catalyst (2E4MI); and
(G) 60 parts by weight of methyl ethyl ketone (MEK).

Comparison 1 (C1)

A resin composition, comprising ingredients as follows:
(A) 100 parts by weight of o-cresol novolac epoxy resin (N-680);

(B) 70 parts by weight of styrene maleic anhydride copolymer (EF-40);
(C) 50 parts by weight of DOPO-BPFN (XLC-950);
(D) 50 parts by weight of fused silica;
(E) 0.3 parts by weight of catalyst (2E4MI); and
(F) 60 parts by weight of methyl ethyl ketone (MEK).

Comparison 2 (C2)

A resin composition, comprising ingredients as follows:
(A) 100 parts by weight of o-cresol novolac epoxy resin (N-680);
(B) 70 parts by weight of styrene maleic anhydride copolymer (EF-40);
(C) 68 parts by weight of DOPO-BPFN (XLC-950);
(D) 50 parts by weight of fused silica;
(E) 0.3 parts by weight of catalyst (2E4MI); and
(F) 60 parts by weight of methyl ethyl ketone (MEK).

Comparison 3 (C3)

A resin composition, comprising ingredients as follows:
(A) 100 parts by weight of naphthalene epoxy resin (EXA-9900);
(B) 70 parts by weight of styrene maleic anhydride copolymer (EF-40);
(C) 50 parts by weight of phenolic novolac resin (TD-2090);
(D) 50 parts by weight of fused silica;
(E) 0.3 parts by weight of catalyst (2E4MI); and
(F) 60 parts by weight of methyl ethyl ketone (MEK).

Comparison 4 (C4)

A resin composition, comprising ingredients as follows:
(A) 100 parts by weight of naphthalene epoxy resin (EXA-9900);
(B) 70 parts by weight of styrene maleic anhydride copolymer (EF-40);
(C) 80 parts by weight of resorcinol dixylenylphosphate (PX-200);
(D) 50 parts by weight of fused silica;
(E) 0.3 parts by weight of catalyst (2E4MI); and
(F) 60 parts by weight of methyl ethyl ketone (MEK).

Comparison 5 (C5)

A resin composition, comprising ingredients as follows:
(A) 100 parts by weight of naphthalene epoxy resin (EXA-9900);
(B) 50 parts by weight of DOPO-BPFN (XLC-950)
(C) 50 parts by weight of fused silica;
(D) 0.3 parts by weight of catalyst (2E4MI); and
(E) 60 parts by weight of methyl ethyl ketone (MEK).

Comparison 6 (C6)

A resin composition, comprising ingredients as follows:
(A) 50 parts by weight of naphthalene epoxy resin (EXA-9900);
(B) 50 parts by weight of o-cresol novolac epoxy resin (N-680);
(C) 40 parts by weight of styrene maleic anhydride copolymer (EF-40);
(D) 45 parts by weight of DOPO-BPFN (XLC-950);
(E) 20 parts by weight of phenolic novolac resin (TD-2090);
(F) 60 parts by weight of benzoxazine resin (LZ 8280);
(G) 50 parts by weight of fused silica;
(H) 0.3 parts by weight of catalyst (2E4MI); and
(I) 60 parts by weight of methyl ethyl ketone (MEK).

Comparison 7 (C7)

A resin composition, comprising ingredients as follows:
(A) 100 parts by weight of naphthalene epoxy resin (EXA-9900);
(B) 70 parts by weight of styrene maleic anhydride copolymer (EF-40);
(C) 50 parts by weight of DOPO-BPFN (XLC-950);
(D) 105 parts by weight of benzoxazine resin (LZ 8280);
(E) 50 parts by weight of fused silica;
(F) 0.3 parts by weight of catalyst (2E4MI); and
(G) 60 parts by weight of methyl ethyl ketone (MEK).

The resin compositions of embodiments 1-6 are shown in Table 1. The resin compositions of comparisons 1-7 are shown in Table 3.

The resin compositions of embodiments 1-6 and comparisons 1-7 were evenly mixed in a mixing tank by batch and transferred to an impregnation tank. Then, a glass fiber fabric was passed through the impregnation tank to allow the resin composition to be attached to the passing glass fiber fabric. Afterward, the resin composition-coated glass fiber fabric was baked and semi-cured to become a prepreg.

Take four pieces of prepreg from the same batch and two pieces of 18 μm copper foils and stack them in the order of a copper foil, four pieces of prepreg, a copper foil. Then, the two copper foils and the prepreg therebetween were laminated together in a vacuum condition and at 200° C. for two hours to form a copper clad laminate, wherein the four pieces of prepreg were cured to form an insulating layer between the two copper foils.

A physical properties measurement process was performed on the copper clad laminate, and a copper-free laminate resulting from a copper foil etching process. The physical properties measurement process measures: solder dip test of copper-clad laminate (perform solder dip at 288° C. for 10 seconds, and measure the number of dip cycles, S/D), solder dip test of copper-free laminate after undergoing pressure cooker test to absorb moisture (undergo pressure cooking at 121° C. for one hour and then solder dip at 288° C. for 20 seconds to observe the presence of delamination), dielectric constant (wherein Dk is the lower the better), dielectric dissipation factor (wherein Df is the lower the better), flame retardation (flaming test, UL94, wherein the top to bottom rankings are: V-0, V-1, and V-2) and observe prepreg (PP) appearance.

The results of measurement of the resin compositions of embodiments 1-6 are shown in Table 2. The results of measurement of the resin compositions of comparisons 1-7 are shown in Table 4.

TABLE 1

| ingredient | | E1 | E2 | E3 | E4 | E5 | E6 |
|---|---|---|---|---|---|---|---|
| epoxy resin | EXA-9900 | 100 | 100 | 100 | 100 | 100 | 100 |
| styrene maleic anhydride copolymer | EF-40 | 70 | 5 | 100 | 70 | 70 | 40 |
| DOPO-BPFN | XLC-950 | 50 | 50 | 50 | 25 | 80 | 45 |
| benzoxazine resin | LZ 8280 | 0 | 0 | 0 | 0 | 0 | 60 |

TABLE 1-continued

| ingredient | | E1 | E2 | E3 | E4 | E5 | E6 |
|---|---|---|---|---|---|---|---|
| inorganic filler | Fused silica | 50 | 50 | 50 | 50 | 50 | 50 |
| catalyst | 2E4MI | 0.3 | 0.3 | 0.3 | 0.3 | 0.3 | 0.3 |
| solvent | MEK | 60 | 60 | 60 | 60 | 60 | 60 |

TABLE 2

| property test | E1 | E2 | E3 | E4 | E5 | E6 |
|---|---|---|---|---|---|---|
| S/D, dip cycles | >10 | 8 | 4 | >10 | >10 | >10 |
| PCT (1 hr), dip 288° C., 20 s | pass | pass | delamination | pass | pass | pass |
| Dk (2 GHz) | 4.15 | 4.36 | 4.13 | 4.15 | 4.18 | 4.15 |
| Df (2 GHz) | 0.0082 | 0.0105 | 0.0079 | 0.0082 | 0.0090 | 0.0080 |
| flaming test(UL94) | V-0 | V-0 | V-0 | V-1 | V-0 | V-0 |
| PP appearance | smooth | smooth | rough | smooth | smooth | smooth |

When compared with the halogen-free composition of the present invention in embodiment 1, the overly small amount of the styrene maleic anhydride copolymer in embodiment 2 accounts for an overly high dielectric constant of the halogen-free composition, whereas the overly large amount of the styrene maleic anhydride copolymer in embodiment 3 accounts for poor PP appearance and deteriorated heat resistance of the copper-clad substrate (PCT board delaminated).

When compared with the halogen-free composition of the present invention in embodiment 1, the overly small amount of the DOPO-BPFN resin in embodiment 4 causes the unsatisfactory flame retardation effect therein, whereas the overly large amount of the DOPO-BPFN resin in embodiment 5 accounts for deteriorated dielectric characteristics of the halogen-free composition in embodiment 5.

When compared with the halogen-free composition of the present invention in embodiment 1, the benzoxazine resin in embodiment 6 causes a slight decrease in the dielectric dissipation factor (Df) of the halogen-free composition.

A comparison of embodiment 1 with comparisons 1-7 reveals the following findings. In comparison 1 where o-cresol novolac epoxy resin (N-680) substitutes for naphthalene epoxy resin, although the heat resistance of copper clad laminates remains unchanged, both the dielectric constant (Dk) and dielectric dissipation factor (Df) become overly high, and the flame retardation of copper clad laminates is downgraded to level V-1. In comparison 2, an increase in the amount of the DOPO-BPFN added promotes the flame retardation of copper clad laminates to level V-0, whereas causes overly high the dielectric constant (Dk) and dielectric dissipation factor (Df). In comparison 3, DOPO-BPFN is substituted with phenolic novolac resin (TD-2090) to function as a co-crosslinking agent and thereby cause a decrease in flame retardation and a great increase in the dielectric constant (Dk) and dielectric dissipation factor (Df). In comparison 4, a usual phosphorus-containing flame retardant (PX-200) is in use, and in consequence both the dielectric characteristics and the heat resistance of copper clad laminates deteriorate (PCT board delaminate). In comparison 5, a lack of styrene maleic anhydride copolymer causes unsatisfactory dielectric characteristics and heat resistance. A comparison of embodiment 6 with comparison 6 reveals that the use of o-cresol novolac epoxy resin (N-680) and phenolic novolac resin causes an increase in the dielectric constant (Dk) and dielectric dissipation factor (Df). In comparison 7, a glut of benzoxazine resin deteriorates the heat resistance of copper clad laminates.

As described above, the present invention meets the three requirements of patentability, namely novelty, non-obvious-

TABLE 3

| ingredient | | C1 | C2 | C3 | C4 | C5 | C6 | C7 |
|---|---|---|---|---|---|---|---|---|
| epoxy resin | EXA-9900 | 0 | 0 | 100 | 100 | 100 | 50 | 100 |
| | N-680 | 100 | 100 | 0 | 0 | 0 | 50 | 0 |
| styrene maleic anhydride copolymer | EF-40 | 70 | 70 | 70 | 70 | 0 | 40 | 70 |
| DOPO-BPFN | XLC-950 | 50 | 68 | 0 | 0 | 50 | 45 | 50 |
| resorcinol dixylenylphosphate | PX-200 | 0 | 0 | 0 | 80 | 0 | 0 | 0 |
| phenolic novolac resin | TD-2090 | 0 | 0 | 50 | 0 | 0 | 20 | 0 |
| benzoxazine resin | LZ8280 | 0 | 0 | 0 | 0 | 0 | 60 | 105 |
| inorganic filler | fused silica | 50 | 50 | 50 | 50 | 50 | 50 | 50 |
| catalyst | 2E4MI | 0.3 | 0.3 | 0.3 | 0.3 | 0.3 | 0.3 | 0.3 |
| solvent | MEK | 60 | 60 | 60 | 60 | 60 | 60 | 60 |

TABLE 4

| property test | Test method | C1 | C2 | C3 | C4 | C5 | C6 | C7 |
|---|---|---|---|---|---|---|---|---|
| S/D | dip cycles | >10 | >10 | >10 | 2 | 7 | >10 | 8 |
| PCT (1 hr) | dip 288° C., 20 s | pass | pass | pass | delamination | pass | pass | pass |
| Dk | 2 GHz | 4.23 | 4.26 | 4.34 | 4.28 | 4.36 | 4.21 | 4.15 |
| Df | 2 GHz | 0.0093 | 0.0099 | 0.0113 | 0.0095 | 0.0109 | 0.0091 | 0.0079 |
| flaming test | UL94 | V-1 | V-0 | V-1 | V-0 | V-0 | V-0 | V-0 |
| other | PP appearance | smooth | smooth | smooth | smooth | smooth | smooth | smooth | ness, and industrial applicability. Regarding novelty and non-obviousness, the halogen-free resin composition of the present invention features specific ingredients, and is characterized by specific proportions thereof, to thereby attain a low dielectric constant, low dielectric dissipation, high heat resistance, and high flame retardation, and produce a prepreg or a resin film, and is thus applicable to copper clad laminates, and printed circuit boards. Regarding industrial applicability, products derived from the present invention meet market demands fully.

The present invention is disclosed above by preferred embodiments. However, persons skilled in the art should understand that the preferred embodiments are illustrative of the present invention only, but should not be interpreted as restrictive of the scope of the present invention. Hence, all equivalent modifications, and replacements made to the aforesaid embodiments should fall within the scope of the present invention. Accordingly, the legal protection for the present invention should be defined by the appended claims.

What is claimed is:

1. A halogen-free resin composition, comprising:
   (A) 100 parts by weight of naphthalene epoxy resin;
   (B) 10 to 100 parts by weight of styrene maleic anhydride copolymer; and
   (C) 30 to 70 parts by weight of DOPO-containing bisphenol F novolac resin.

2. The halogen-free resin composition of claim 1, wherein a styrene to maleic anhydride ratio of the styrene maleic anhydride copolymer is 1/1, 2/1, 3/1, 4/1, 6/1, or 8/1.

3. The halogen-free resin composition of claim 1, further comprising 10 to 70 parts by weight of benzoxazine resin.

4. The halogen-free resin composition of claim 1, further comprising at least one selected from the group consisting of an inorganic filler, a curing accelerator, a silane coupling agent, a toughening agent, and a solvent.

5. The halogen-free resin composition of claim 4, further comprising at least one selected from the group consisting of phenol resin, phenol novolac resin, polyphenylene ether resin, cyanate ester resin, isocyanate ester resin, maleimide resin, polyester resin, styrene resin, butadiene resin, phenoxy resin, polyamide resin, polyimide resin, and modified derivatives thereof.

6. A prepreg, comprising the halogen-free resin composition of claim 1.

7. A copper clad laminate, comprising the prepreg of claim 6.

8. A printed circuit board, comprising the copper clad laminate of claim 7.

* * * * *